United States Patent [19]

Jones et al.

[11] 4,205,099
[45] May 27, 1980

[54] METHOD FOR MAKING TERMINAL BUMPS ON SEMICONDUCTOR WAFERS

[75] Inventors: Leith Jones, Wakefield, Mass.; N. Christian McGrath, Strafford, N.H.

[73] Assignee: Sprague Electric Company, North Adams, Mass.

[21] Appl. No.: 896,256

[22] Filed: Apr. 14, 1978

[51] Int. Cl.² .......................... C23C 3/00; C25D 5/02
[52] U.S. Cl. ........................................ 427/90; 204/15; 427/92
[58] Field of Search ...................... 204/15; 427/90, 92, 427/98, 305, 430 A, 430B, 438

[56] References Cited

U.S. PATENT DOCUMENTS

| | | | |
|---|---|---|---|
| 3,096,262 | 7/1963 | Shockley | 204/146 |
| 3,495,324 | 2/1970 | Guthrie et al. | 29/578 |
| 3,669,734 | 6/1972 | Jacob et al. | 427/90 |
| 3,760,238 | 9/1973 | Hamer et al. | 357/69 |

OTHER PUBLICATIONS

IBM Technical Disclosure Bulletin, vol. 16, No. 7, Dec. 1973 p. 2296.

*Primary Examiner*—T. M. Tufariello
*Attorney, Agent, or Firm*—Connolly and Hutz

[57] ABSTRACT

A method is described for making terminal pads, and more particularly solderable bump terminals on a plurality of semiconductor devices formed in a silicon wafer. Two spaced aluminum layers have electrical connection to the P-type region and the N-type region, respectively, of a PN junction of each device. A permanent protective glass layer is deposited over the active face of the wafer, having holes opened over the terminal pads. The wafer is covered with a temporary insulative masking layer except over terminal pad portions of the two aluminum layers, respectively. The wafer is submersed in a zinc plating solution and subsequently in a nickel plating solution to form a nickel bump on the terminal pad portions. A dark environment is provided about the PN junctions to avoid deplating aluminum from some of the aluminum pads due to photo-electric currents in the immersion solution. The masking layer prevents formation of unwanted spurious nickel bumps through cracks in the glass layer during the plating step and further reduces stray current paths to other regions of the wafer.

20 Claims, 11 Drawing Figures

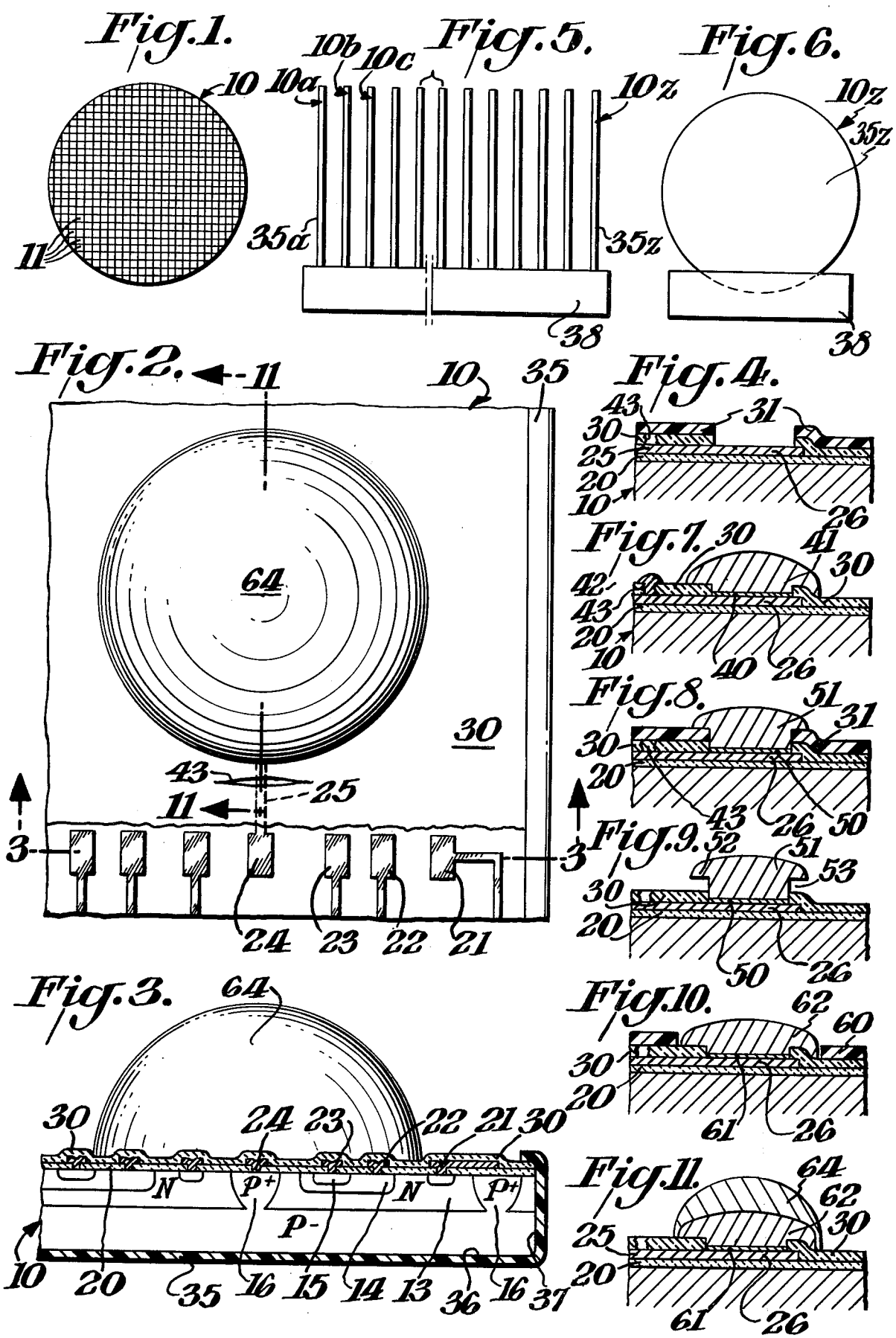

METHOD FOR MAKING TERMINAL BUMPS ON SEMICONDUCTOR WAFERS

BACKGROUND OF THE INVENTION

This invention relates to a method for making terminal pads on a semiconductor device. In the manufacture of semiconductor integrated circuits and transistors, an insulative layer is formed over the surface of the semiconductor and electrical connection is made between particular surface regions of the semiconductor device by aluminum film strips overlying the insulative layer and contacting the particular regions through holes provided therefor in the insulative layer.

It is often preferred to provide metal bumps on the pads and to make external connections by "face bonding" the device to a printed circuit. This may be achieved by the well known method of "flip chip" attachment that may be simply accomplished by reflow soldering. Aluminum presents serious difficulties in such bonding methods since it rapidly acquires an insulative oxide film over its exposed surfaces and is not directly solderable. For these reasons, one or more other metals such as zinc, nickel, copper and gold have been applied over the aluminum contact pads. Depositing of these other metals over the aluminum usually involves immersion and plating in a liquid bath containing an electrolyte.

For reasons heretofore not fully appreciated, the plated metal termination exhibits a high series resistance or in some cases presents an open circuit. These extreme conditions occur at only certain terminations on a given device and only some of the time.

It is therefore an object of this invention to overcome the above noted disadvantages of the prior art.

It is a further object of this invention to provide solderable terminals on a semiconductor device having uniformly thick aluminum under-layers with an over-layer of another metal.

It is yet a further object of this invention to provide high quality terminals that extend as solderable bumps from a face of the device.

SUMMARY OF THE INVENTION

A method for making solderable bump terminals on each of a plurality of semiconductor devices is described. Each device has at least one PN junction and a group of the devices is formed in a semiconductor wafer, the PN junctions thereof being formed at a front surface of the wafer.

A first electrically insulative layer, such as silicon dioxide, is formed over the aforesaid front surface. Two spaced aluminum film strips are formed over this insulative layer contacting the P-type and N-type regions, respectively, of the PN junction of each device through vias provided therefor in the first insulative layer. A second insulative layer, preferably quartz, is formed over the first layer and over the aluminum strips.

A masking layer is applied over the second layer, and holes are opened through both the second layer and the masking layer in a region over a contract pad portion of each of the two aluminum strips, respectively. The masking layer prevents formation of spurious metal bumps during subsequent plating steps through microcracks in the second layer.

The wafers are immersed in a nickel plating solution to form through the holes a nickel bump over each of the pads while a dark environment is provided at the PN junctions to prevent generation by the junctions of photoelectric currents. The effect of the prevention of photoelectric currents through the electrolytic plating bath is to substantially reduce the unwanted deplating of aluminum from the terminal pads contacting the P type material of the PN junctions. This second source of unwanted deplating can be eliminated by the additional steps of insulating all surfaces of the wafer from the plating bath except the aluminum terminal pads. Though not completely understood, non-photo electric currents may still exist between the terminal pads and exposed surface areas of the semiconductor wafer, which represent another mechanism for selectively deplating the aluminum from the terminal pads.

It is thus preferred in the method of this invention to coat the back of the wafer with an insulative coating, which coating may be a light attenuating coating to simultaneously reduce the ambient light during plating at the PN junctions. This back-coating preferably extends over the peripheral edges of the wafer. The masking layer is also preferably insulative, and preferably extends over the entire front wafer surface being only open over the terminal pads and sealing at the wafer periphery with the back coating.

Of course, any insulative layer material will have a certain light attenuation property. After selecting the particular layer material and thickness for the masking layer and the back coating, the additional means necessary for obtaining a suitable dark environment at the PN junctions can then be determined. Either or both of the masking layer and the back coating may serve to at least partially attenuate light at the PN junctions. The masking layer may thus serve the three functions of covering cracks in the second insulative layer over the aluminum strips, insulating the front surface of the wafers and at least partially shielding light from the PN junctions.

Thus the process of this invention makes possible the mass production of semiconductor devices with high quality bump terminals and without spurious bumps which tend to cause misconnection or shorts after face bonding the semiconductor device to a printed circuit.

BRIEF DESCRIPTION OF THE DRAWING

FIG. 1 shows a front face of a silicon wafer having a plurality of semiconductor devices form therein.

FIG. 2 shows in magnified detail a portion of one of the devices of FIG. 1 located near the periphery of the wafer. A portion of the overlying quartz layer is broken away in an area over the contact pads.

FIG. 3 shows in cross-sectional view the detail portion of FIG. 2 taken in plane 3—3.

FIG. 4 shows in cross-sectional view a terminal pad region of the device of FIG. 2 taken in plane 11—11, at an intermediate point in the process after depositing a quartz layer and before plating. The scale of FIG. 4 is about ½ that of FIG. 2.

FIG. 5 shows in a side view a plurality of wafers that are similar to the wafer of FIG. 1 and that are stacked in a wafer rack.

FIG. 6 shows in end view the stack of wafers of FIG. 5.

FIG. 7 shows in cross-sectional view the region of FIG. 4 after nickel plating without an insulative layer over the quartz.

FIG. 8 shows in cross-sectional view the region of FIG. 4 after nickel plating with a photo resist layer over the quartz.

FIG. 9 shows in cross-sectional view the region of FIG. 8 after removal of the overlying photo resist layer.

FIG. 10 shows in cross-sectional view the region of FIG. 4 after nickel plating with a photo resist layer over the quartz, which photo resist layer has a larger diameter hole than the mutually concentric hole in the underlying quartz.

FIG. 11 shows in cross-sectional view, after removal of the overlying photo resist layer of FIG. 10, a region of the device of FIG. 2 taken in plane 11—11.

DESCRIPTION OF THE PREFERRED EMBODIMENTS

A silicon wafer 10 is shown in FIG. 1 having a large number of integrated circuits 11 formed therein. A portion of one of the integrated circuits, illustrated in FIGS. 2 and 3, includes a planar NPN transistor having a collector region 13 of N-type conductivity, a P-type base region 14 and an N-type emitter region 15. A P-type isolation wall 16 surrounds the transistor. An insulative layer of silicon dioxide 20 covers the front surface of the wafer 10. Spaced aluminum strips 21, 22, 23 and 24 make contact through vias in the silicon dioxide layer 20 to the collector 13, base 14, emitter 15 and isolation regions 16, respectively. With reference to FIGS. 2, 3 and 4, the aluminum strip 24 includes connective strip portion 25 that leads to a relatively large aluminum contact pad 26 (about 45 square mils or 28000 square microns). The structure thus far described is produced by well known methods including masking, doping the silicon regions with conductivity-altering elements as by diffusion, depositing or thermally growing the silicon oxide layer and selectively depositing the separate aluminum strips.

Another insulative layer 30 is deposited over the front surface of the wafer. This is accomplished in the preferred embodiment by sputtering quartz over the front surface. Other inorganic materials, such as silicon nitride may be used. Alternatively, an organic varnish such as polyimide is suitable. Subsequently, via holes are opened in the insulative layer 30 in regions directly over contact pad portions (e.g. 26) of the aluminum layers at which electrical access to the integrated circuit may be obtained. This is accomplished by the standard technique of applying a photo resist layer 31 over the quartz layer 30, exposing layer 31 to light in a region around the aluminum contact pad 26, by developing and selectively removing the photo resist material 31 over the pad 26 and selectively etching away the quartz 30 through the photo resist hole which leads to the structure illustrated in FIG. 4. The photo resist layer 31 would normally then be removed, but in one process of this invention it remains at least until terminal bumps have been formed as is further elaborated below.

In preparation for the above mentioned bump forming steps, a coating 35 is deposited on the back surface 36 and edge surface 37 of the wafer 10. The coating 35 is an epoxy resin varnish, namely type PC-17 made by the Hysol Division of the Dexter Corp., Industry, Calif. The liquid resin is applied to the back surface of the wafer by pouring and spinning (a standard means for applying coatings of photo resist). It is applied to the peripheral edge by swabbing with a cotton wad. The epoxy is cured by heating for about an hour at 125° C., producing an insulative light-attenuating coating 35 of about 0.004 inch (0.1 mm) thick and having an amber hue.

Each wafer is then swabbed with a mild detergent to remove oils and particles of dust from the exposed aluminum surfaces of the contact pads. The wafers are then rinsed in deionized water for 5 minutes.

A number of back-coated wafers 10a, 10b, 10c through 10z having aluminum pads 26 exposed as in FIG. 4 are stacked and spaced in a wafer rack 38 as shown in FIG. 5. The distance between the adjacent of the wafers is about 0.5 inch (1.3 cm). Wafer 10a at the left end of the stack is oriented so that the coating 35a on the back side thereof faces outwardly (to the left). Similarly, the coating 35z of wafer 10z faces outwardly at the right end of the stack as illustrated in FIGS. 5 and 6. When the stack of wafers is subsequently immersed, as will be described, in an electrolyte that is light-transmissive, the ambient light is substantially prevented from being transmitted to the wafers and from striking the P-N junctions formed in any one of the stacked wafers since the coated wafers serve as light shields with respect to each other. In a modification of the above light shielding means, either one or both of the end wafers 10a and 10z may be replaced by an opaque dummy wafer or the like.

Other light shielding means may be employed during immersion, such as placing an opaque cover over the electrolyte tank (not shown). The tank and cover are in this case both made opaque. However, the above noted wafer coating means may be preferred to permit ready access by the operator to the wafers being processed, to permit convenient insertion and control of electrolyte stirring means, temperature monitoring and control devices, etc., into the electrolyte while at the same time supplying an adequate ambient light environment in which the operator may work most efficiently.

The ambient light may be reduced in the case that it is supplied artificially, by a standard dimming means, which ambient light reduction may be sufficient in combination with a limited light shielding means, e.g. the above noted back-coating and stacking of wafers, to provide the necessary dark environment at the PN junction. Alternatively, an artificial source of ambient light may be shut off entirely in which event there will be no need for light shielding.

The air induced film of aluminum oxide formed on the surface of the aluminum pads is removed by immersing the stacked wafers for about 2 minutes at 25° C. into a zinc immersion-plating solution, ALUMON-D, supplied by Ethone, Inc., New Haven, Conn. This solution is strongly alkaline having a pH of about 13. The aluminum oxide is removed and a very thin zinc film on the order of a hundred angstroms thickness is plated out over the bare aluminum through the hole in the quartz, as illustrated in FIG. 7.

The wafers are then rinsed in deionized water for 5 minutes at room temperature, and the thin zinc film, which may have gettered impurities from the underlying aluminum surface, is removed by immersing the wafers for 30 seconds in a 50% (by volume) nitric acid solution at 25° C. The wafers are rinsed again for 5 minutes and immediately immersed in the above noted zinc plating solution for 15 to 30 seconds at room temperature, forming a thin film of zinc 40 over the aluminum.

After a further rinse in deionized water for 5 minutes the wafers are immersed in an electroless nickel plating solution, ENPLATE 416 M also supplied by Ethone, Inc., at 95° C. for 1 hour to selectively deposit a layer or bump of nickel 41 about 0.002 inch (0.051 mm) thick over the aluminum pad 26. The photo resist layer 31 is then removed. If the photo resist layer 31 were to be removed prior to plating, spurious nickel bumps 42 are formed over the aluminum strips at randomly occurring microcracks 43 in the quartz layer, as is illustrated in FIG. 7. The wanted terminal bump is composed of zinc film 40 and nickel layer 41. Spurious bumps may lead to circuit shorts or misconnections when the device is face bonded to a printed wiring pattern.

Numerous means have been described above for limiting the intensity of light that impinges upon the wafer surfaces during plating. Whether this is accomplished by any one or by any combination of such means, it is estimated that this light intensity should be maintained below about 5 foot candles to provide a suitably dark environment and thus prevent substantial "deplating" of aluminum pads by photo-currents through the plating electrolytes. The aluminum terminal pad 26 leading to the P-type region tends to deplate at a relatively high rate compared to that of the aluminum terminal pad (not shown) leading to the N-type region. The rate of unwanted deplating due to photo-currents is believed to be about proportional to the intensity of light at the PN junctions. It is also a direct function of the temperature and the strength of the electrolyte while the amount of deplating effected is directly related to the time of exposure.

In an experiment wherein the wafers had no back coating and in a laboratory having no windows but being illuminated by conventional fluorescent light fixtures in the ceiling, it was observed after the first zinc plating step, that the aluminum contact pads (e.g 26) connected to the P+ isolation regions (e.g. 16) were either much thinner or completely removed.

Removal at plating of some or all of the aluminum pads that are electrically connected to a P-type region is substantially corrected by processing in near darkness. It has been discovered however that some though less removal from these particular pads will occur, for example during zinc immersion plating, in a totally dark room. It was further found that the technique of light shielding, which includes coating the backs of the wafers with electrically insulative material and using an opaque immersion vessel and cover, caused and even smaller reduction in thickness of these aluminum pads. When the coating is extended over the edge surface of the wafer even less thinning of the pads occurs. It is advantageous to apply an insulative masking layer 31 over the quartz (or the like) protective layer 30, which covers the entire top surface of the substrate 10, except at the terminal pads. Concentric holes in the two layers, respectively, confine the terminal bump formation to the desired pads. This top-most insulative masking layer 31 together with the insulative back and edge coating 35 totally prevents electrical access by the electrolyte to the substrate, except through the holes in the layer over the pads, and consequently when the junctions are exposed to no more than 5 foot candles of light, there is no selective reduction in thickness of the pads.

It is often desired to bare portions of the front surface of the semiconductor wafer, in bands or streets separating the individual devices formed in the wafer, in order to more effectively scribe and break apart the individual devices at a later time. Such bare streets would normally permit contact of the electrolyte to the bare semiconductor body. The above described insulative masking layer 31 prevents such contact.

In one process of this invention, the photo resist layer 31 is left intact during the plating steps to serve as the masking layer so that such microcracks in the underlying quartz 30 are covered and none of the unwanted spurious nickel bumps are produced. The resulting structure is illustrated in FIG. 8, wherein the zinc film 50 and nickel layer 51 comprise the bump. However, after removal of the photo resist layer 31, the nickel bump 51 is seen to have a cantilevered peripheral portion 52 and a gap 53 is formed about the bump which tends to trap dirt and the corrosive fluxes to be employed in subsequent solder operations.

In a preferred process of this invention, the photo resist layer 31 is stripped from the wafer 10 prior to plating and a new photo resist masking layer 60 is applied. A hole is opened in the photo resist layer 60 that is essentially concentric with the underlying hole in the quartz and that has a greater diameter, as is illustrated in FIG. 10. The subsequent plating steps lead to a terminal bump consisting of zinc film 61 and nickel layer 62. The nickel plating is stopped prior to the diameter of the nickel bump becoming as large as the diameter of the hole in masking layer 60. Subsequent removal of layer 60 leaves no cantilevered portions of the nickel 62.

The coating 35 is removed by immersing the wafers for 10 minutes in an organic solvent, namely M-PYROL made by GAF Corp., New York, N.Y. The wafers are subsequently cleaned by swabbing with a detergent solution and rinsed in deionized water.

The wafers are then baked at about 170° C. in a nitrogen atmosphere for 3 hours to improve the adhesion of the zinc and nickel layer to the underlying aluminum. In subsequent steps a suitable solder-flux is applied to the front surface of the wafers and the wafers are then immersed in a hot molten solder to form a layer of solder 64 over the nickel layer 62 which further builds the bump terminal outwardly from the front surface of the wafer, as shown in FIG. 11. The nickel layer 62 is highly solderable and consequently in the method of this invention a wide variety of solders may advantageously be employed with a minimum of care and control in the solder application steps being required. In particular 60Sn/40Pb and 5Sn/95Pb may be used.

What is claimed is:

1. A method for making solderable bump terminals on each of a plurality of semiconductor devices, a group of said plurality of devices being formed in each of a plurality of wafers, each of said semiconductor devices having at least one PN junction formed at a front surface of one of said wafers, comprising
    (a) forming a first insulative layer over said front surface of each of said wafers;
    (b) forming over said first layer two spaced aluminum film strips that contact the P-type and the N-type regions, respectively, of said PN junction through vias provided in said first insulative layer;
    (c) forming a second insulative layer over said first insulative layer and over said aluminum strips;
    (d) applying a masking layer over said second insulative layer;
    (e) opening holes, through both said masking layer and said second layer, in a region over a terminal pad portion of each of said two aluminum strips, respectively;
    (f) immersing said wafers in a nickel plating solution to form through said holes a nickel bump over each of said pads; and (g) providing a dark environment at said PN junction during said immersing; whereby said darkness prevents the generation by said PN junction of photo electric currents and whereby said masking layer prevents the formation of spurious metal bumps through microcracks in said second layer during said immersing steps.

2. The method of claim 1 wherein said providing said dark environment is at least partially accompanied by applying an insulative light attenuating coating to the back surface and peripheral edge surface of each said wafer, prior to said immersing.

3. The method of claim 2 additionally comprising, prior to said immersing, after said opening and during said providing, immersing said wafers in a zinc plating solution to remove the air induced oxides on said aluminum pads to selectively plate through said holes a film of zinc thereon.

4. The method of claim 3 additionally comprising, after said immersing in said zinc solution, immersing said wafers in an acid solution to remove said zinc film; rinsing said acid from said wafers; and immersing said wafers in said zinc solution to again form a zinc film on said pads, after which said wafers are subjected to said immersing in said nickel solution.

5. The method of claim 2 wherein said providing is further accomplished by spacing and stacking said plurality of wafers in a rack prior to said immersing, and positioning the end-most wafers of said stack so that said coated back surfaces thereof are facing outwardly of said stack.

6. The method of claim 1 wherein said providing is at least partially achieved by shielding said PN junction from the ambient light.

7. The method of claim 6 wherein said shielding is effected by rendering opaque the immersion vessel containing said electrolyte and covering said vessel during said immersing with an opaque cover.

8. The method of claim 6 wherein said shielding is at least partially achieved by applying light attenuating coating to the back surface of said each wafer, additionally comprising spacing and stacking said plurality of wafers in a rack prior to said immersion, and placing an opaque dummy wafer adjacent to an end of said stack at which an end-most wafer of said stack is oriented with said front surface facing outwardly.

9. The method of claim 1 wherein said dark environment is effected at least in part by substantially reducing the intensity of the ambient light.

10. The method of claim 1 wherein said masking layer is of an insulative material and extends entirely over said front wafer surface except at said terminal pads.

11. The method of claims 2 and 10 wherein said masking layer is sealed to said insulative coating at said wafer periphery.

12. The method of claim 1 wherein said masking layer is a photo resist layer and said opening of said holes is accomplished by selectively exposing said photo resist layer to light, chemically removing said photo resist layer in a region over said pads and etching said second layer through said holes in said photo resist layer to provide concentric holes of essentially constant radius through said masking layer and said second layer, respectively, over each said pad.

13. The method of claim 1 wherein said opening is accomplished by first opening a hole in said second layer in a region over each of said pads, subsequently implementing said applying said masking layer, said opening including forming in said masking layer over each said pad a hole of greater diameter than and essentially concentric with said hole in said underlying second layer.

14. The method of claim 13 wherein said immersing to form a nickel bump is terminated prior to said bump acquiring a diameter as large as said greater diameter of said hole in said masking layer.

15. The method of claim 1 additionally comprising removing said masking layer after said immersing steps.

16. The method of claim 1 additionally comprising applying a layer of solder over said nickel bumps.

17. A method for making solderable bump terminals on each of a plurality of semiconductor devices, a group of said plurality of devices being formed in a silicon wafer, each of said semiconductor devices having at least one PN junction formed at a front surface of said wafer, including providing aluminum conductor strips contacting predetermined regions, respectively, of said each device, applying one insulative layer over said strips and said front face, and opening a hole in said one layer over a terminal pad portion of each of said strips; the improvement comprising forming an electrically insulative coating over the back surface of said wafer, forming an insulative masking layer over said one insulative layer, opening a hole over each said terminal pad portion that is concentric with the corresponding of said holes in said one layer, immersing said wafer in a nickel plating solution to form a nickel bump over each said pad portion by plating through said concentric holes in said one and another layers and providing an ambient light level at said wafer of less than about 5 foot candles during said immersing.

18. The method of claim 17 wherein said coating is an epoxy resin.

19. The method of claim 17 wherein said one insulative layer is quartz.

20. The method of claim 17 wherein the diameter of each said hole in said masking layer is greater than said corresponding concentric hole in said one layer.

* * * * *